(12) United States Patent
Sekiguchi et al.

(10) Patent No.: US 7,889,015 B2
(45) Date of Patent: Feb. 15, 2011

(54) OSCILLATION DEVICE

(75) Inventors: Ryota Sekiguchi, Kawasaki (JP);
Toshihiko Ouchi, Sagamihara (JP)

(73) Assignee: Canon Kabushiki Kaisha, Tokyo (JP)

( * ) Notice: Subject to any disclaimer, the term of this patent is extended or adjusted under 35 U.S.C. 154(b) by 0 days.

(21) Appl. No.: 12/091,393

(22) PCT Filed: Dec. 20, 2007

(86) PCT No.: PCT/JP2007/075234
§ 371 (c)(1),
(2), (4) Date: Apr. 24, 2008

(87) PCT Pub. No.: WO2008/075795
PCT Pub. Date: Jun. 26, 2008

(65) Prior Publication Data
US 2010/0164636 A1    Jul. 1, 2010

(30) Foreign Application Priority Data
Dec. 21, 2006 (JP) .............................. 2006-344565

(51) Int. Cl.
*H03B 5/12* (2006.01)
(52) U.S. Cl. .............................. 331/107 T; 331/108 C; 331/96; 250/340; 372/96; 372/43.01; 257/25
(58) Field of Classification Search ............. 331/107 T, 331/108 C, 96; 372/96, 43.01; 250/340, 250/251; 257/25, 20, 24, 27
See application file for complete search history.

(56) References Cited

U.S. PATENT DOCUMENTS 5,586,131 A    12/1996    Ono et al.
5,659,560 A    8/1997    Ouchi et al.
5,699,373 A    12/1997    Uchida et al.

(Continued)

FOREIGN PATENT DOCUMENTS

EP    1 863 140    12/2007

(Continued)

OTHER PUBLICATIONS

PCT International Search Report and Written Opinion of the International Searching Authority, dated Apr. 17, 2008 in PCT/JP2007/075234.

(Continued)

*Primary Examiner*—Arnold Kinkead
(74) *Attorney, Agent, or Firm*—Fitzpatrick, Cella, Harper & Scinto

(57) ABSTRACT

To provide an oscillation device having a long oscillation wavelength in which wavelength variable width is relatively broad and wavelength sweep rate is relatively high. An oscillation device includes a gain medium having a gain with respect to an electromagnetic wave to be oscillated, cavity structures for resonating the electromagnetic wave, and energy injection means and for injecting pumping energy into the gain medium. The gain medium is sandwiched between a first negative permittivity medium and a second magnetic permittivity medium each of which real part of permittivity with respect to the electromagnetic wave is negative. Electric field application means is provided for at least one of the first negative permittivity medium and the second negative permittivity medium to apply an electric field for changing a depletion region formed at a boundary part with the gain medium.

5 Claims, 10 Drawing Sheets

U.S. PATENT DOCUMENTS

| | | | |
|---|---|---|---|
| 5,764,670 A * | 6/1998 | Ouchi | 372/45.01 |
| 6,301,282 B1 | 10/2001 | Capasso et al. | |
| 6,854,901 B1 | 2/2005 | Ouchi | |
| 7,062,116 B2 | 6/2006 | Ouchi | |
| 7,248,995 B2 | 7/2007 | Itsuji et al. | |
| 7,386,024 B2 | 6/2008 | Sekiguchi et al. | |
| 2005/0058166 A1 | 3/2005 | Hu et al. | |
| 2005/0276298 A1 | 12/2005 | Fischer et al. | |
| 2006/0085160 A1 | 4/2006 | Ouchi | |
| 2006/0197021 A1 | 9/2006 | Ouchi | |
| 2006/0214176 A1 | 9/2006 | Ouchi et al. | |
| 2006/0227340 A1 | 10/2006 | Shioda et al. | |
| 2006/0244629 A1 | 11/2006 | Miyazaki et al. | |
| 2007/0030115 A1 | 2/2007 | Itsuji et al. | |
| 2007/0091951 A1 | 4/2007 | Bour et al. | |
| 2007/0195921 A1 | 8/2007 | Ouchi | |
| 2007/0215808 A1 | 9/2007 | Sekiguchi et al. | |
| 2007/0229094 A1 | 10/2007 | Kasai et al. | |
| 2007/0235718 A1 | 10/2007 | Kasai et al. | |
| 2007/0252604 A1 | 11/2007 | Ouchi et al. | |
| 2008/0048792 A1 | 2/2008 | Ouchi et al. | |

FOREIGN PATENT DOCUMENTS

| | | |
|---|---|---|
| JP | 2000138420 | 5/2000 |
| WO | 2006-104233 | 10/2006 |

OTHER PUBLICATIONS

Müller, et al., "Electrically tunable, room-temperature quantum-cascade lasers", Applied Physics Letters, vol. 75, No. 11, Sep. 13, 1999, pp. 1509-1511.

U.S. Appl. No. 11/632,958, filed Jan. 19, 2007, Ouchi, T.

U.S. Appl. No. 10/587,261, filed Jul. 26, 2006, Sekiguchi, R.

Benjamin S. Williams, et al, "Terahertz Quantum-Cascade Laser At $\lambda \approx 100$ μm Using Metal Waveguide for More Confinement", Applied Phys. Lett., vol. 83, No. 11, (2003), 2124-2126.

Masahiro, A., "Density-Matrix Modeling of Terahertz Photon-Assisted Tunnleing and Optical Gain in Resonant Tunneling Structures", Jpn. Jour. Appl. Phys., vol. 40, 5251-5256 (2001).

International Preliminary Report on Patentability dated Jul. 2, 2009 in corresponding International Application No. PCT/JP2007/075234.

* cited by examiner

OSCILLATION DEVICE

TECHNICAL FIELD

The present invention relates to an oscillation device including a gain medium sandwiched between negative permittivity media of which real part of permittivity with respect to an electromagnetic wave is negative. In particular, the present invention relates to a current injection type oscillation device including a waveguide through which surface plasmon with an electromagnetic wave having a frequency within a frequency region from 30 GHz to 30 THz (called millimeter wave and terahertz wave, particularly a region near 30 GHz and a region near 30 THz are respectively called millimeter wave band and terahertz band in this specification) is propagated, and serving to change the depletion region by applying an electric field through electric field control means to allow oscillation wavelength to be variable.

BACKGROUND ART

A new type of semiconductor laser called quantum cascade laser which operates based on transition of carriers between energy levels of carrier within a single energy band such as conduction band or valence band (transition between sub-bands). Oscillation wavelength of a quantum cascade laser depends on level distance between two energy levels with respect to optical transition. Accordingly, oscillation wavelength can be selected over a broad spectrum region (from mid-infrared region to terahertz region). Initially, it was verified that such a laser can be realized by a configuration in which an oscillation wavelength is selected to be equal to 4.2 µm of the mid-infrared region. In recent years, due to an increasing demand for electromagnetic resource of terahertz region useful for biosensing, longer wavelength lasers having an oscillation wavelength on the longer wavelength side relative to the mid-infrared region has been performed.

Such a longer wavelength laser includes, along with a configuration of a gain medium having gain in that frequency region, a structure called surface plasmon waveguide capable of performing tight light confinement into the gain medium. Such a longer wavelength laser differs from a conventional semiconductor laser which performs light confinement by using a dielectric clad structure. As such a longer wavelength laser, there is proposed a configuration using as clad a negative permittivity medium of which real part of permittivity is negative (see Japanese Patent Application Laid-Open No. 2000-138420). In the configuration, guided by the clad is an electromagnetic wave called surface plasmon to which polarization oscillation of charged carriers within the negative permittivity medium contributes. Since no diffraction limit exists for such surface plasmon, a substantial part of mode intensity can be confined within the gain medium. By using such a technique, laser oscillation at an oscillation wavelength as long as 11.4 µm is realized.

There is also proposed a configuration in which a pair of negative permittivity media of which real part of permittivity is negative are disposed as clad at upper and lower sides of a gain medium (see Benjamin S. Williams, et al.; Appl. Phys. Lett., Vol. (2003), 2124). Also in this case, guided by the clad is surface plasmon. In a gain medium where two negative permittivity media are disposed as clad, a greater part of mode intensity can be confined within the gain medium as compared to the configuration of Japanese Patent Application Laid Open No. 2000-138420. By using such a technique, laser oscillation at an oscillation wavelength as long as about 100 µm (3 THz) is realized.

On the other hand, in such longer wavelength lasers having a structure called surface plasmon waveguide, a technology for allowing oscillation wavelength to be variable is not well known. The technique known to the date uses temperature adjustment means which is typical in the field of optical semiconductor laser. For example, in the above-cited Benjamin article, it is reported that a variable range of about 4% was realized by temperature adjustment from 5 K to 77 K.

DISCLOSURE OF THE INVENTION

However, the configuration using temperature adjustment for allowing oscillation wavelength to be variable in the known long wavelength laser has problems in connection with two points as described below. Namely, the width from the upper limit to the lower limit where oscillation wavelengths are rendered to be variable (wavelength variable width) is relatively narrow, and a rate for sweeping oscillation wavelength (wavelength sweep rate) is relatively low. Therefore, also in long wavelength lasers, a technique for allowing the oscillation wavelength to be variable is required, except for the technique of temperature adjustment, which can solve these problems.

In view of the above-described problems, a first aspect of the present invention is directed to an oscillation device including a gain medium having a gain with respect to an electromagnetic wave to be oscillated, a cavity structure for resonating the electromagnetic wave, and energy injection means for injecting pumping energy into the gain medium, which includes the following configuration. Namely, the gain medium is sandwiched between a first negative permittivity medium and a second negative permittivity medium, each of the first and second permittivity media being such that real part of permittivity thereof with respect to the electromagnetic wave is negative. Further, electric field application means is provided for at least one of the first negative permittivity medium and the second negative permittivity medium so as to apply an electric field for changing a depletion region formed at a boundary part with the gain medium.

Moreover, a second aspect of the present invention is directed to an oscillation device for oscillating an electromagnetic wave having a frequency selected from a frequency region from 30 GHz to 30 THz, which includes a first negative permittivity medium of which real part of permittivity with respect to the electromagnetic wave is negative, a second negative permittivity medium of which real part of permittivity with respect to the electromagnetic wave is negative, a gain medium sandwiched between the first negative permittivity medium and the second negative permittivity medium and having a gain with respect to the electromagnetic wave, and a drive electrode for injecting carriers into the gain medium to drive the gain medium, wherein the oscillation device further includes a control electrode to change thickness of a depletion region formed between at least one of the first and second negative permittivity media and the gain medium for controlling oscillation wavelength, and the control electrode is configured to be capable of applying an electric potential independently of the drive electrode.

In accordance with the oscillation device of the present invention, a scheme is employed to change, at a relatively high rate, the depletion region at the boundary part between the gain medium and the negative permittivity medium to thereby change oscillation wavelength. Accordingly, if a relatively thin gain medium is used (this can be performed as described later), the size of the depletion region can be adjusted by a relatively large ratio with respect to the region of the gain medium. Thus, there can be realized an oscillation device with a long oscillation wavelength, which is broader in wavelength variable width and is higher in wavelength sweep rate, as compared to the related art.

Followed by this, the oscillation device of the present invention can be effectively applied particularly in the field of millimeter wave and terahertz wave, e.g., to spectrum inspection and identification of material based thereon used in biosensing, as well as high speed information communication.

Further features of the present invention will become apparent from the following description of exemplary embodiments with reference to the attached drawings.

BEST MODES FOR CARRYING OUT THE INVENTION

Exemplary embodiments of the present invention will now be described with reference to the attached drawings while describing the principle of the present invention.

Figure 1A:
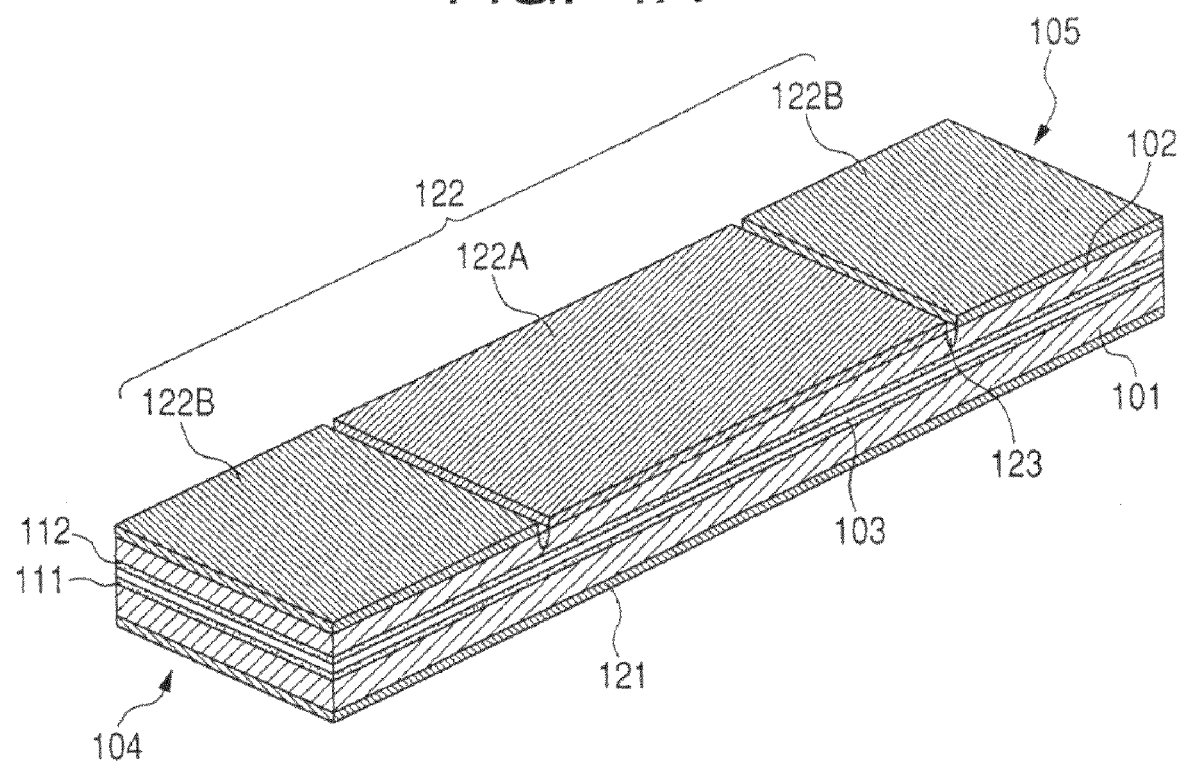
FIGS. 1A, 1B and 1C are diagrams illustrating an exemplary embodiment of an oscillation device according to the present invention.
Figure 1B:
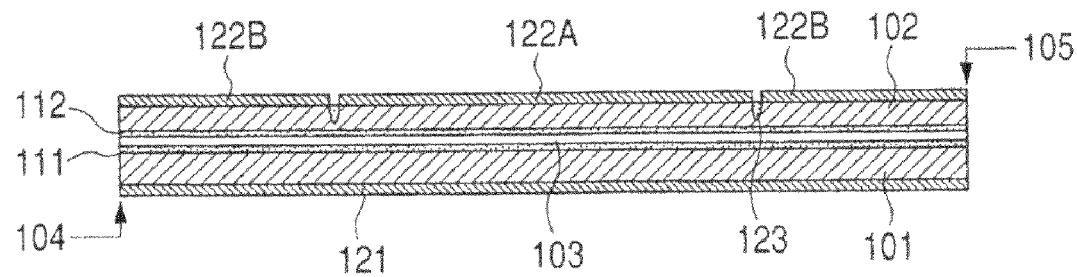

FIGS. 1A and 1B illustrate the configuration of an exemplary embodiment of an oscillation device to which the present invention is applied. In FIGS. 1A and 1B, negative permittivity media 101 and 102 are materials having negative real part of permittivity in a frequency region of an electromagnetic wave to be oscillated. In the frequency region of millimeter wave and terahertz wave, the negative permittivity medium is formed of, e.g., carrier-doped semiconductor (e.g., InAs, InP, GaAs, Si), metal (e.g., Ag, Au, Cu, Al), or these plural materials (metal and carrier-doped semiconductor). Since the negative permittivity medium is also conductive material in the typical case, transparent conductive film (ITO) may be selected.

Moreover, in FIGS. 1A and 1B, a gain medium 103 is sandwiched between the negative permittivity media 101, 102 at upper and lower parts thereof. In general, a gain medium is a material such that when pumping energy is injected by energy injection means, a gain is generated. Here, the gain medium 103 is a material such that when carrier is injected, gain is generated. In order to perform current injection from the outside, it is necessary to allow the gain medium 103 and negative permittivity media 101, 102 to be electrically in contact with each other. To this end, a high concentration carrier doped semiconductor can be utilized as electrical contacts 111, 112 as occasion demands. Here, the high concentration refers to a carrier concentration such that at least real part of permittivity becomes negative. In addition, there are provided electrodes 121 and 122 (122A, 122B). In such a configuration, the negative permittivity media 101, 102, and electrical contacts 111, 112 function as a clad serving as a geometrical optical reflection plane surface with respect to the millimeter wave and terahertz wave.

Accordingly, in an electromagnetic wave guided by such clads (negative permittivity media 101, 102 and electrical contacts 111, 112), surface plasmon without diffraction limit is permitted as guided mode.

Figure 1C:
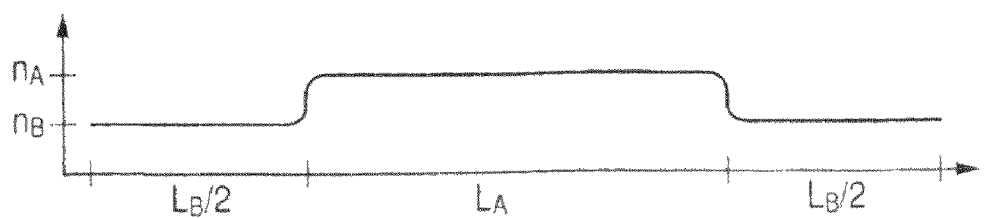

Meanwhile, there are instances where depletion region may take place in a circumstance as described below at boundary parts between the gain medium 103 and negative permittivity media 101, 102. It is to be noted that in the case where the electrical contacts 111, 112 are provided as illustrated in FIGS. 1A, 1B and 1C, the above-mentioned boundary part refers to the boundary between each electrical contact and the gain medium 103.

As an example where the depletion region takes place, the case where electrodes are provided in such a manner that the gain medium 103 is sandwiched therebetween so that an electric field is applied from the electrodes is the typical example thereof. The depletion region is a region where carrier concentration is temporarily lowered, and does not temporarily function as a clad with respect to the millimeter wave and terahertz wave which are guided. Here, the low concentration refers to a carrier concentration such that the real part of permittivity becomes positive.

Accordingly, when any electric field is applied in such a manner that the gain medium 103 is sandwiched therebetween, the geometrical reflection plane surface is withdrawn by the depletion region so that the region of the clad is withdrawn. As a result, the distribution of the guided mode would be enlarged. When an applied electric field is changed, the region of the clad is changed (withdrawn or advanced) by change of the depletion region. Thus, the distribution of guided mode is increased or decreased (enlarged or contracted). When the geometrical reflection plane surface is withdrawn so that the distribution of the guided mode is enlarged, the equivalent refractive index that the guided mode senses is lowered. In contrast, when the geometrical reflection plane surface is advanced so that the distribution of the guided mode is contracted, the equivalent refractive index that the guided mode senses increases. By this increase or decrease of the equivalent refractive index, resonant wavelength is changed so that oscillation wavelength is changed.

The present invention positively uses a phenomenon such that the boundary (serving as geometrical optical reflection plane surface) between the part of the negative real part of permittivity and the part of the positive real part of permittivity in the clad is withdrawn or advanced with respect to the gain medium 103. Further, in order to generate, annihilate or change the depletion region where such a phenomenon takes place, control of an electric field applied to the gain medium forming the waveguide and the part of the clad (negative permittivity medium and electrical contact) is required. Accordingly, change of the equivalent refractive index in the present invention has a mechanism entirely different from change of the equivalent refractive index that the guided mode senses, which is based on current or voltage control known in the wavelength variable optical semiconductor laser, in connection with the following points. Namely, the present invention differs from the related art in that the negative permittivity medium is used as a clad; that surface plasmon waveguide defined on the geometrical optical reflection plane surface is used; and that the distribution of guided mode is increased or decreased by movement on the reflection plane surface resulting from change of the depletion region to increase or decrease the equivalent refractive index to thereby change resonant wavelength.

As such gain medium 103, e.g., a resonant tunneling diode may be used. Moreover, there may be used a semiconductor multilayer structure including several hundred to several thousand layers used in quantum cascade laser.

As a method for performing electric field control of the depletion region, there is a method in which a pair of electrodes applying a drive electric field for injecting carriers into the gain medium 103 are disposed, and a pair of electrodes between which the gain medium 103 is sandwiched are disposed separately therefrom in such a manner to permit electric field control of the depletion region. In this case, as ground electrodes in two sets of electrode pairs, a ground electrode common thereto may be used.

In the exemplary embodiment of FIGS. 1A and 1B, the electrode 122 is divided into a drive electrode (first electrode) 122A and control electrodes (third electrode) 122B along the propagation direction in the surface plasmon waveguide of an electromagnetic wave to be oscillated, and the electrode 121 is used as a ground electrode (second electrode) to thereby realize the above-mentioned electric field control method. It is to be noted that while the present invention is not limited to such an implementation, there may be provided plural sets of drive electrode pair serving as means for injecting pumping energy, or plural sets of electrode pair serving as electric field application means for performing electric field control of the depletion area. Thus, the drive electrode 122A injects carries into the gain medium 103 immediately therebelow, and the control electrode 122B performs electric field control of clad of surface plasmon waveguide immediately therebelow. It is sufficient that respective electrodes are connected to external electric field control means (not shown) to respectively perform drive and control. It is to be noted that, in order to facilitate to apply independent electric potential to the electrodes 122A and 122B, i.e., in order to reduce current flowing from the electrode 122A to the electrode 122B via the negative permittivity medium 102, an electrode separation region 123 may be provided at the electrodes 122A and 122B. By the above-mentioned configuration, electric field control of the depletion region can be performed independently of drive. For this reason, e.g., even an electric field such that gain vanishes in the gain medium 103 can be utilized for the purpose of increase/decrease control of the depletion region. In addition, there may be also employed configurations having a DBR structure, DR structure and DFB structure in which control electrodes as described later are distributed.

It is to be noted while the control electrodes 122B are provided on both sides of drive electrode in FIGS. 1A and 1B, it is not necessarily required to provide such electrodes on both sides. For example, there may be employed a configuration including only a control electrode on the near side of the figure in FIG. 1A, the drive electrode; and the first negative permittivity medium, the gain medium, the second gain medium, and the common electrode 121 serving as opposite electrode of the drive electrode and the control electrode, which are located at the lower part of first-mentioned electrodes.

Next, FIG. 1B illustrates an oscillation device cross sectional configuration for indicating a cavity structure. Moreover, FIG. 1C illustrates the state of the distribution of the equivalent refractive index that the guided mode senses. Here, the cavity structure is simply formed by end faces 104, 105. The surface plasmon guided by clads (negative permittivity media 101, 102 and electrical contacts 111, 112) oscillates by Fabry-Perot etalon formed by these end faces 104, 105 so that oscillation is produced. The wavelength of an electromagnetic wave oscillated in the configuration illustrated in FIGS. 1B and 1C is represented by the following formula (1)

$$m\lambda = 2(n_A L_A + n_B L_B) \quad (1)$$

where m is the order (integer) of the longitudinal mode, $n_A$ is equivalent refractive index that guided mode immediately below drive the electrode 122A senses, and $L_A$ is length of the surface plasmon wave path immediately external electric field control unit the drive electrode 122A. Moreover, $n_B$ is equivalent refractive index that the guided mode immediately below the control electrode 122B senses, and $L_B$ is length of the surface plasmon waveguide immediately below the control electrode 122B. An electric field applied by the control electrode 122B changes $n_B$ to change an oscillation wavelength λ, as indicated by the formula (1), or to contribute to such a mode hopping to change m. Whether one change or the other change is selected may be also determined depending upon the length of $L_A$ or $L_B$. Accordingly, wavelength variable width depends upon change of $n_B$. For simplicity, when consideration is made in connection with the case where there is no mode hopping, the following formula (2) is provided.

$$\delta\lambda/\lambda = \delta n_B L_B / (n_A L_A + n_B L_B) \quad (2)$$

The wavelength variable width δl/l is proportional to change quantity $\delta n_B$ of equivalent refractive index that the guided mode senses. For example, in the case of $n_A L_A = n_B L_B$, the wavelength variable width is equal to $0.5 \times \delta n_B / n_B$. Namely, this indicates that change rate $\delta n_B / n_B$ of equivalent refractive index determines wavelength variable width $\delta\lambda/\lambda$ rather than change quantity $\delta n_B$ of equivalent refractive index.

In the present invention, it is desired for broadly selecting the wavelength variable width that the change rate of equivalent refractive index that the guided mode senses is relatively large. In the present invention, since there is utilized the phenomenon that a clad is withdrawn by a depletion region produced to broaden the distribution of guided mode, it is sufficient to employ the configuration in which a spread quantity is caused to be an equivalent quantity with respect to the primary guided mode distribution. To realize this, employment of a method of selecting the gain medium 103 having a thickness of the same order of the thickness of the depletion region, or thickness equal to the above or less is simple. This is because there is upper limit in an electric field which can be applied, and the thickness of a depletion region produced indicates the upper limit of the submicron order. Accordingly, it is desirable to select the gain medium 103 having a thickness thinner than that thickness.

As an example thereof, there are Resonant Tunneling Diode (RTD) based on photon-assisted tunneling, and Resonant Inter-band Tunneling Diode (RITD) based on photon-assisted tunneling. The RTD uses multiple quantum well including quantum well and tunnelable barrier within conduction band or valence band. The RTD in any case is a tunneling diode of the structure to perform inter-subband transition of carriers. The RITD is a tunneling diode using tunnelable pn junction or Type II hetero-junction, and having a structure in which carriers perform interband transition.

This tunneling diode is also called Esaki diode. Since both tunneling diodes are based on tunneling of carriers, it can be said that the thickness of the gain medium 103 can be thinner than the thickness of a depletion region which can be produced.

An example of the thickness thereof is indicated below. In the case where an RTD is selected, the thickness of the gain medium 103 is, e.g., 10 nm. On the other hand, when an electric field is applied to the RTD, the thickness of a depletion region produced at the boundary part between the gain medium 103 and the electrical contacts 111, 112 is, e.g., about 10 nm. At this time, spread in upper and lower directions (lamination direction) of guided mode is primarily 10 nm. When a depletion region takes place, both thicknesses are added so that the total thickness becomes equal to 20 nm. In the case where an RITD is selected, the thickness of the gain medium 103 is, e.g., 1 nm. On the other hand, when an electric field is applied to the RITD, the thickness of a depletion region produced at the boundary part between the gain medium 103 and the electrical contacts 111, 112 is, e.g., about 1 nm. At this time, spread in upper and lower directions of the guided mode distribution is primarily 1 nm. When a depletion region takes place, both thicknesses are added so that the total thickness becomes equal to 2 nm. Therefore, in both cases, there is employed a configuration in which spread becomes equal to an equivalent quantity with respect to the primary guided mode. For this reason, the change rate of equivalent refractive index is relatively large. This is desirable.

For reasons stated above, e.g., a wavelength variable width of 10% or more can be provided. Moreover, in the case of the former (RTD), since this tunneling diode is a unipolar high speed device in which delay time of carrier is relatively small, high speed operation of, e.g., nano sec. order can be expected as wavelength sweep rate. Namely, as compared to relative low speed heat conduction, or temperature adjustment in which high speed operation is difficult because of relatively large specific heat, the operation speed is high.

It is to be noted that in the case where the gain that the gain medium 103 has reaches a frequency region lower than millimeter wave band (frequency region lower than 30 GHz), there is the possibility that parasitic RF oscillation may take place. This can be prevented in a manner as described below. Namely, parasitic RF oscillation is oscillation based on RC time constant. For example, time constant by an RC resonant circuit from the gain medium 103 up to external electric field application means (not shown) via the electrodes 121, 122 is also a cause of parasitic RF oscillation. Therefore, there may be added a configuration to deliver an electric field between the electrodes 121, 122 through bias T, or a configuration to separately insert a resistor between the electrodes 121, 122.

EXAMPLES

More practical examples will now be described.

Example 1

Figure 2A:
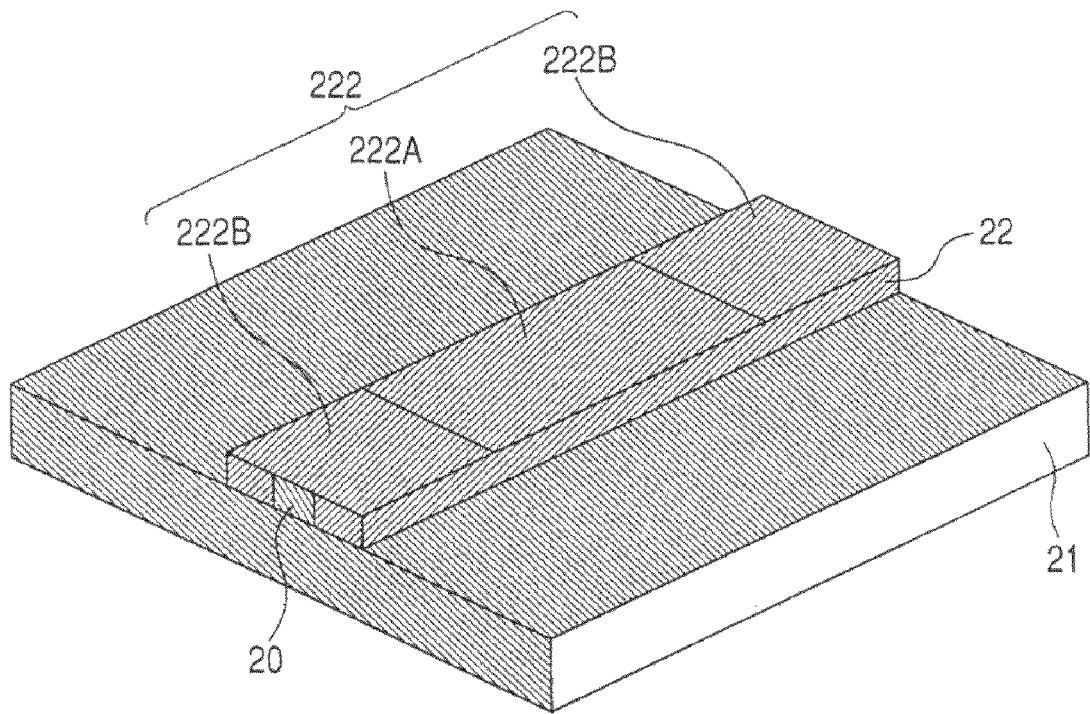
FIGS. 2A and 2B are diagrams showing the configuration of an oscillation device of Example 1.
Figure 2B:
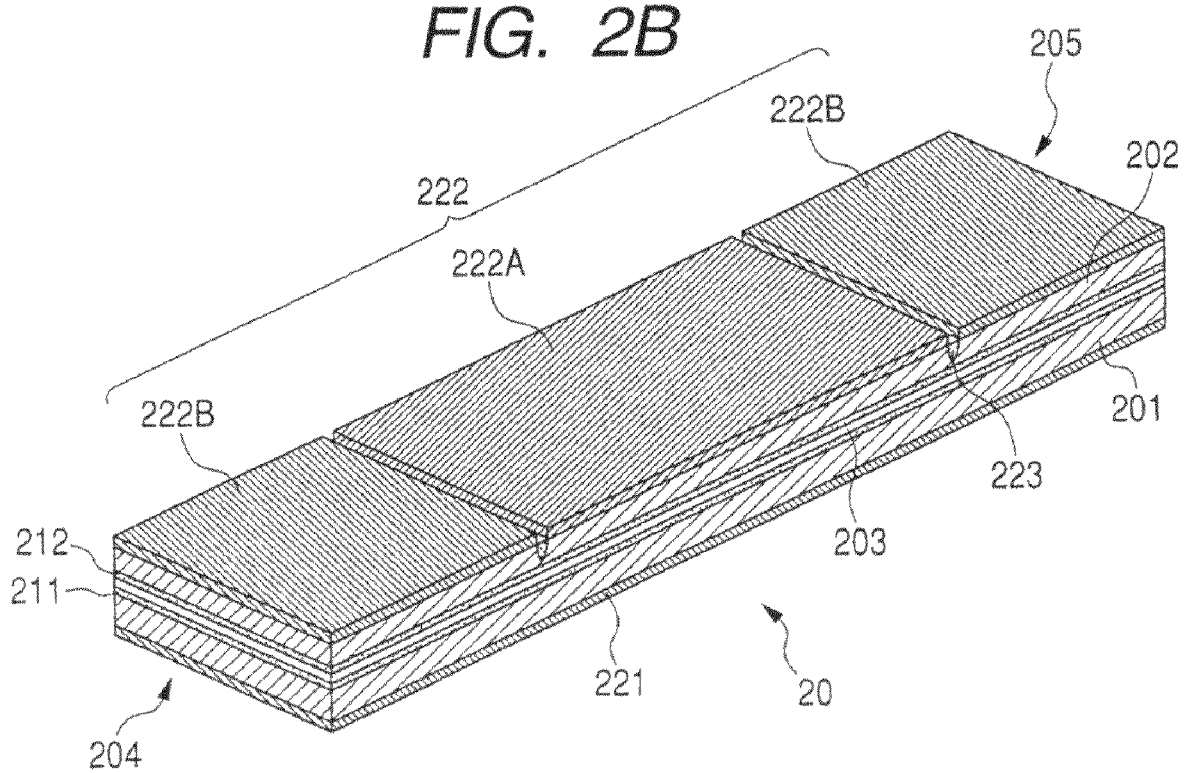

FIGS. 2A and 2B illustrate a first example of an oscillation device to which the present invention is applied. FIG. 2B illustrates, in an enlarged manner, a device body 20 illustrated in FIG. 2A. In this example, a gain medium is a resonant tunneling diode (RTD) based on photon-assisted tunneling. Gain produced in the RTD is observed as negative resistance in DC. In this case, it is considered that the gain broadly extends from millimeter wave band up to terahertz band. Accordingly, the RTD is a desirable example as a gain medium forming an oscillation device to which the present invention can be applied.

In FIG. 2B, a gain medium 203 is an RTD, and is of the configuration in which three barrier layers are used like spacer layer/barrier layer/well layer/barrier layer/well layer/barrier layer/spacer layer, for example. In order to realize this configuration, lattice-matched InGaAs may be used on InP substrate as well layer, and lattice-matched InAlAs or non-matched AlAs may be used as the barrier layer. In more practical sense, there is configured to include a semiconductor multilayer structure of InGaAs (thickness 5.0 nm)/AlAs (1.3 nm)/InGaAs (7.6 nm)/InAlAs (2.6 nm)/InGaAs (5.6 nm)/AlAs (1.3 nm)/InGaAs (5.0 nm) in order from the emitter side toward the collector side. When all layers are caused to be undoped layers in which carrier doping is not intentionally performed, free electron absorption loss in the gain medium 203 can be disregarded.

The RTD has a gain in frequency regions of millimeter wave and terahertz wave on the basis of phenomenon called photon-assisted tunneling. For example, the RTD has peak current density of 60 kA/cm$^2$ at the time when an electric field of 0.3 V is applied, and indicates negative resistance within the range from 0.3 V to 0.6 V. When the negative resistance is analyzed in more detail, it is considered that there is provided a gain of the order of 200 cm$^{-1}$ in the frequency region from 0.3 THz to 1 THz at the time when, e.g., an electric field of 0.4 V is applied. (see Jpn. Jour. Appl. Phys., Vol. 40, 5251 (2001) with respect to analysis of RTD). Such a gain medium 203 is sandwiched between electrical contacts 211, 212 doubling as negative permittivity medium. The electrical contacts 211, 212 of the gain medium 203 is configured so as to include a semiconductor film of, e.g., n-InGaAs (50 nm) which is lattice-matched with an InP substrate. This semiconductor film has electron concentration of $1 \times 10^{18}$ cm$^{-3}$ by using Si as dopant.

Further, the gain medium 203 is sandwiched between negative permittivity media 201 and 202 (222A, 222B). In this case, the negative permittivity media 201, 202 are also configured so as to include a semiconductor film of n-InGaAs (100 nm) which is also lattice-matched with an InP substrate. Here, electron concentration is caused to be $1 \times 10^{19}$ cm$^{-3}$. This semiconductor film is in ohmic contact with electrodes 221, 222 such as Ti/Au, etc. It is to be noted that the above-mentioned configuration illustrates an example of the configuration on the InP substrate, but is not limited to such implementation. It is considered that there is provided a semiconductor multilayer configuration such as InAs/AlAsSb or InAs/AlSb on an InAs substrate, GaAs/AlAs on GaAs substrate, or Si/SiGe on an Si substrate.

Such device bodies 20 may be of buried type in which such device bodies 20 are arranged on a transfer substrate 21 in FIG. 2A and are buried by a dielectric material 22. As the dielectric material 22, there is selected a material having low permittivity and small loss such as BCB. When such a selection is made, since a drive electrode 222A and control electrodes 222B (separated by electrode separation regions 223) can be drawn onto the dielectric material 22 (e.g., by about 100 μm in a lateral direction), formation of a structure for electric field supply (wire-bonding) (not shown) to the drive electrode 222A or control electrode 222B becomes easy. Here, dimensions of the device body 20 are set such that size in a propagation direction of surface plasmon is 500 μm and size in a lateral direction is 20 μm. Additionally, in FIG. 2B, the device body 20 includes end faces 204, 205 forming cavity structure and the ground electrode 221.

In the above-mentioned oscillation device configuration, in order to estimate the relationship between the depletion region and voltage of the electrode 222 for performing electric field control thereof, numeric calculation was performed.

In the numeric calculation, modeling of the configuration of the gain medium 203 and clads (negative permittivity media 201, 202 and electrical contacts 211, 212) holding upper and lower parts thereof therebetween in the thickness direction (lamination direction) was one-dimensionally performed to use Poisson's equation so as to have ability to grasp the thickness of the depletion region. Here, it is assumed that difference of Fermi energy between the negative permittivity medium 201 and negative permittivity medium 202 is equal to a voltage of the electrode 222 with the ground electrode 221 being as reference. This method is a method known as those persons skilled in the art. However, in the case of further seeking for accuracy, there may be used a method of solving the Poisson's equation and the Schroedinger's equation in a self-consistent manner.

Figure 3A:
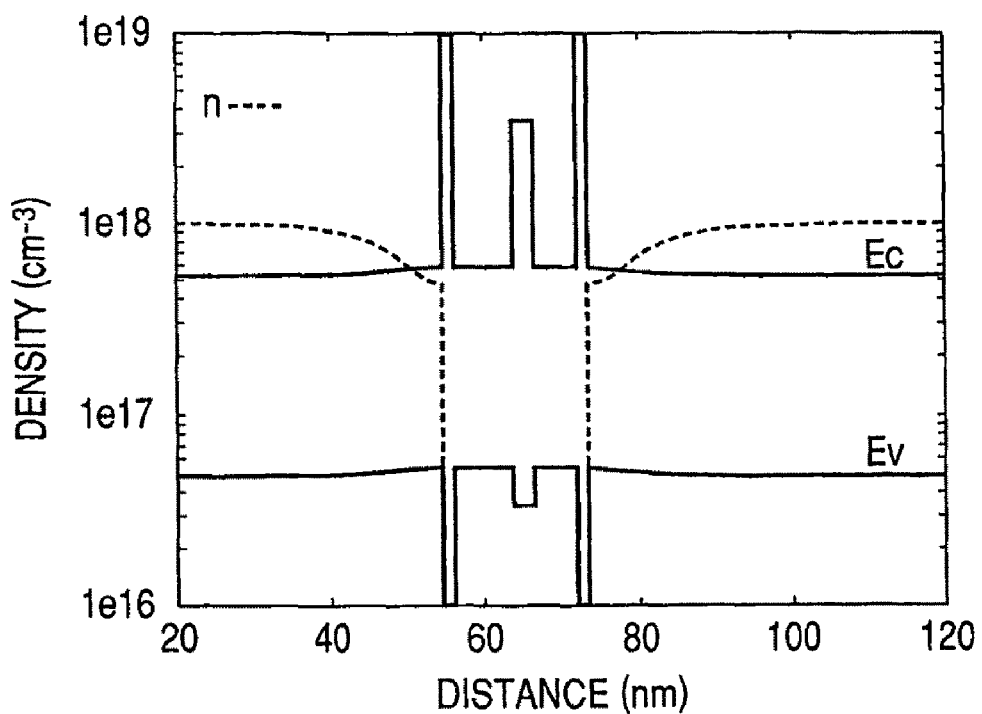
FIGS. 3A, 3B and 3C are diagrams for describing the relationship between electrode voltage and thickness of depletion region of Example 1.
Figure 3B:
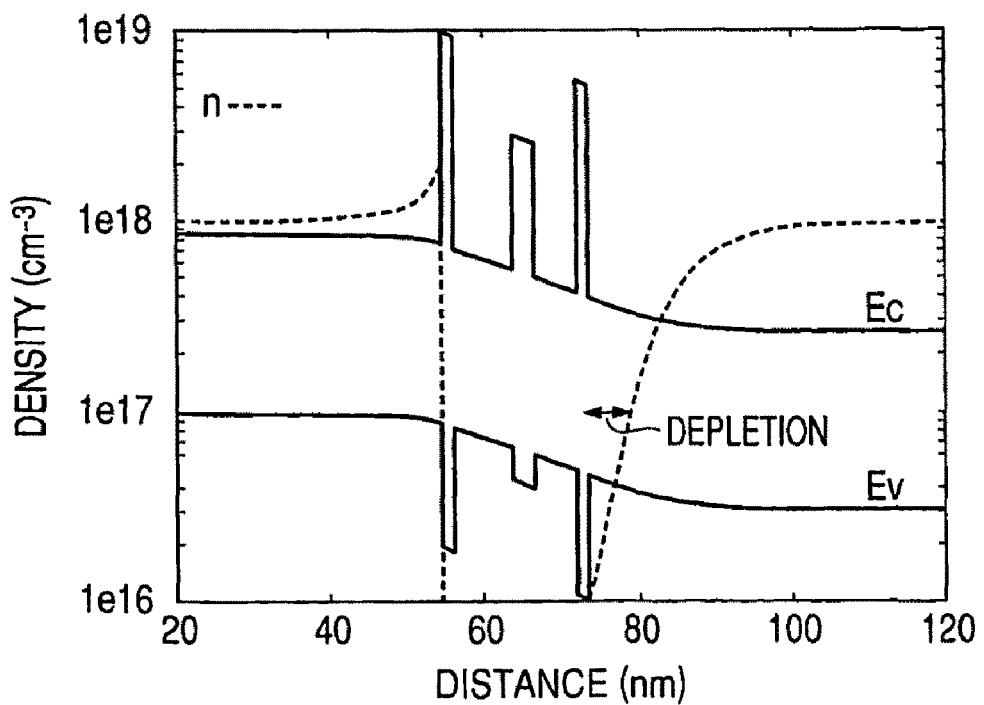
Figure 3C:
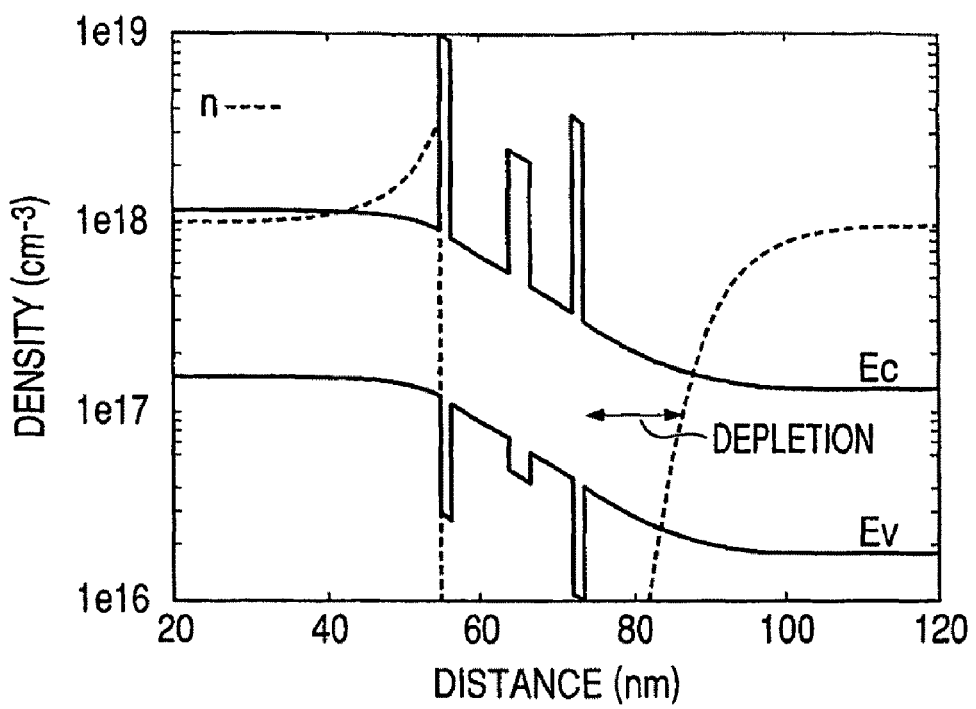

FIGS. 3A to 3C are band diagrams illustrating how the depletion region is changed in accordance with change of voltage of the electrode 222. In FIGS. 3A to 3C, distance (nm) of the abscissa indicates the positional relationship from the emitter up to the collector through the gain medium 203, and corresponds to the upper and lower directions (lamination direction) in FIGS. 2A and 2B. Ec and Ev in FIGS. 3A to 3C respectively represent conduction band edge and valence band edge, and the ordinate indicates arbitrary unit. On the other hand, n represents free carrier concentration in conduction band, and the ordinate indicates density ($cm^{-3}$). Here, the depletion region is the region of low concentration $n<1\times10^{17}$ $cm^{-3}$ such that the real part of permittivity becomes positive, which can be considered as dielectric like when viewed from an electromagnetic wave of terahertz band. The numeric value is an example approximately calculated in the vicinity of 1 THz. Since plasma frequency corresponding to $n=1\times10^{17}$ $cm^{-3}$ exists in the vicinity of 1 THz, definition is made in such a manner. In this case, the plasma frequency is a physical quantity indicating the boundary such that medium including free carrier is deemed as metal like when viewed from an electromagnetic wave with a frequency less than that plasma frequency, and is deemed as dielectric like when viewed from an electromagnetic wave with the plasma frequency or more. In accordance with this definition, in FIGS. 3A to 3C, illustration is performed for easiness of understanding such that the depletion region formed at the boundary part between the gain medium 203 and the clad is visually represented as "depletion". FIG. 3A is a band diagram when voltage of the electrode 222 is 0.0 V. Moreover, FIG. 3B is a band diagram when the voltage of the electrode 222 is 0.4 V, and FIG. 3C is a band diagram when the voltage of the electrode 222 is 0.8 V. It is understood that there is a tendency such that an electric field increases in accordance with increase of voltage, and the depletion region becomes broad in accordance with increase of electric field within the range from 0.0 V to 0.8 V in a manner as stated above. For example, in FIG. 3C, the thickness of the depletion region is broadened by about 13 nm as compared to FIG. 3A.

Figure 3D:
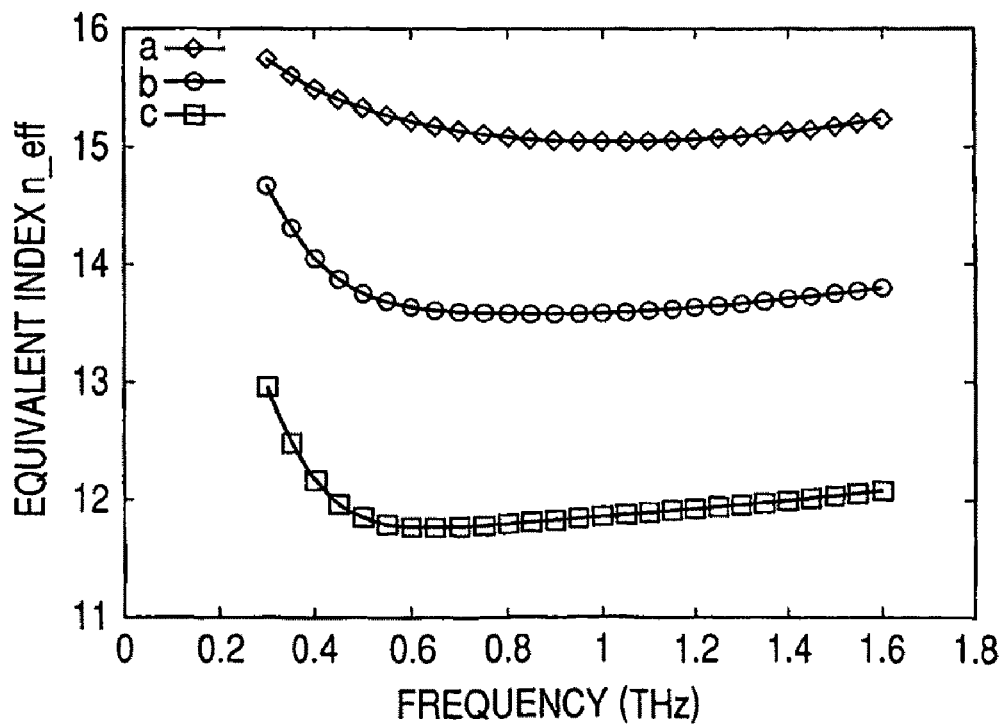
FIG. 3D is a diagram for describing the relationship between thickness of the depletion region and equivalent refractive index of guided mode of Example 1.

FIG. 3D illustrates how equivalent refractive index of guided mode immediately below is changed. To realize this, it is sufficient to reflect respective free carrier concentrations of FIGS. 3A, 3B and 3C in the oscillation device configuration with respect to Drude Model to take such a model as a calculation model. To this end, finite element method solver of the Maxwell's equation was used. This method is also a method known by those persons skilled in the art. In this case, from demand of the finite element solver, graded free carrier concentration was not given for the calculation model. For this reason, modeling was performed such that the dielectric like region of $n<1\times10^{17}$ $cm^{-3}$ is caused to be a rectangular region of $n=1\times10^{16}$ $cm^{-3}$, and the metal like region of $n>1\times10^{17}$ $cm^{-3}$ is caused to be a rectangular region of $n=1\times10^{18}$ $cm^{-3}$ at the part in the vicinity of the boundary of the depletion region defined in a manner previously described. Calculation was performed within the range from 0.3 THz to 1.6 THz as an example, wherein frequency (THz) of the abscissa is frequency of the fundamental guided mode. The ordinate is equivalent refractive index of the fundamental guided mode.

In FIG. 3D, a, b, c respectively reflect FIGS. 3A 3B and 3C. At a corresponding to the case where the voltage of the electrode 222 is 0.0 V, equivalent refractive index of guided mode in the vicinity of, e.g., 0.6 THz is 15.2. At b corresponding to the case where the voltage of the electrode 222 is 0.4 V, equivalent refractive index of the guided mode similarly in the vicinity of 0.6 THz is 13.6. At c corresponding to the case where the voltage of the electrode 222 is 0.8 V, equivalent refractive index of guided mode similarly in the vicinity of 0.6 Tz is 11.8. From the above fact, it can be said that if the voltage of the electrode 222 is reread as voltage of the control electrode 222B as it is, the voltage of the control electrode 222B is swept from 0.0 V up to 0.8 V to thereby have ability to change equivalent refractive index of the guide wave immediately therebelow within the range from 15.2 to 11.8. In the following description, drive, control and oscillation wavelength of this example will be described.

In the above-mentioned oscillation device configuration, an oscillation wavelength is estimated. At the time of ordinary operation, 0.4 V is assumed to be applied to the drive electrode 222A, and 0.4 V is assumed to be applied to the control electrode 222B. At this time, from the formula (1), $\lambda=2\times13.6\times500/m$ (m is integer) holds. For example, when m is assumed to be 27, the oscillation wavelength becomes equal to about 500 μm (0.60 THz) (see FIG. 4). It is to be noted that even if many oscillation modes exist in practice, it is sufficient to select wavelength of about 500 μm by using a filter.

Here, when voltage of the control electrode 222B is swept within the range from 0.0V to 0.8 V, there results a wavelength variable operation. Here, it is assumed that the length $L_A$ of the surface plasmon waveguide immediately below the drive electrode 222A is 250 μm, and the length $L_B$ of the surface plasmon wavelength path immediately below the control electrode 222B is 250 μm. In accordance with the formula (2), when the voltage of the control electrode 222B is 0.0V, $\lambda=2\times(13.6\times250+15.2\times250)/27$ holds, and the oscillation wavelength is changed into about 530 μm (0.5 THz). (see FIG. 4). Moreover, when the voltage of the control electrode 222B is 0.8 V, $\lambda=2\times(13.6\times250+11.8\times250)/27$, and the oscillation wavelength is changed into 470 μm (0.64 THz) (see FIG. 4).

Figure 4:
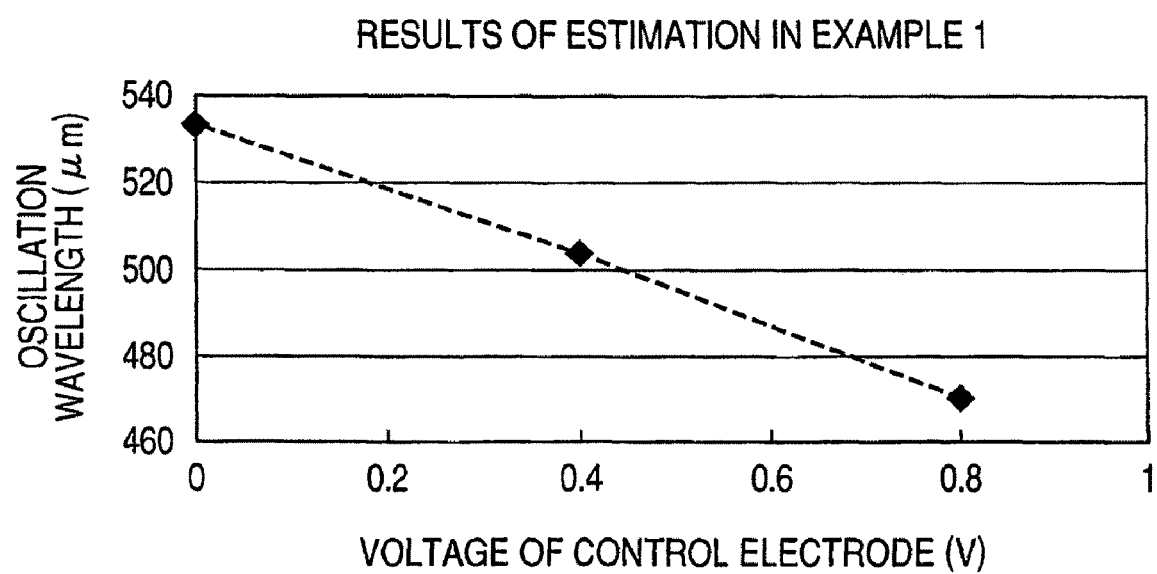
FIG. 4 is a diagram for describing the relationship between voltage applied to a control electrode and oscillation wavelength of Example 1.

Accordingly, when the voltage of control electrode 222B is swept in a manner as shown in FIG. 4, the wavelength variable width becomes equal to about 12%. The above-mentioned numeric values are one example. Therefore, control electric field is further greatly changed thus to have ability to further also enlarge wavelength variable width. This is the merit of this example that independent electric fields can be applied to the respective drive and control electrodes 222A and 222B.

The oscillation device configuration of this example can be fabricated by the following fabrication method.

First, the n-InGaAs layers 202, 212, multiple quantum well 203 by InGaAs/AlAs and n-InGaAs layers 211, 201 are epitaxially grown by Molecular Beam Epitaxy (MBE) process on an InP substrate. The Ti/Au 221 is deposited on the surface thereof as an electrode to perform etching down to the substrate so as to take a mesa shape in which width is 20 μm and length is 500μ as stated above. As etching, there is used dry etching based on photolithography and ICP (Induced Coupling Plasma). Next, bonding based on pressure-fitting is performed between the electrode 221 and the Au thin film on the transfer substrate 21 where an Au thin film is deposited. There may be employed heat-fusing solder such as AuSn, etc. Thereafter, when wet etching is performed by hydrochloric acid, only the InP substrate is selectively removed. For this reason, there results a form such that the mesa-shaped epitaxial layer is transferred onto the transfer substrate 21.

Next, the BCB 22 was coated by spin-coat process. Thereafter, the mesa-shaped epitaxial layer is exposed. Finally, the drive electrode 222A and control electrode 222B were formed, by the lift-off process, on the surface of the n-InGaAs layer 202 which has appeared after the InP substrate has been removed. Thus, the above-mentioned configuration is completed. In this case, for formation of an electrode separation area 223, etching of the n-InGaAs layer 202 may be performed with the photoresist utilized in the lift-off process being as a mask.

In accordance with this example, size of the depletion region can be adjusted by a relatively large ratio with respect to the region of the gain medium 203 at a relatively high rate by electric field application through the control electrode 222B as stated above. As a result, the equivalent refractive index that the guided mode senses can be greatly changed. Accordingly, there can be realized an oscillation device which is broad in wavelength variable width and is high in wavelength sweep rate as compared to the related art.

Example 2

Figure 5A:
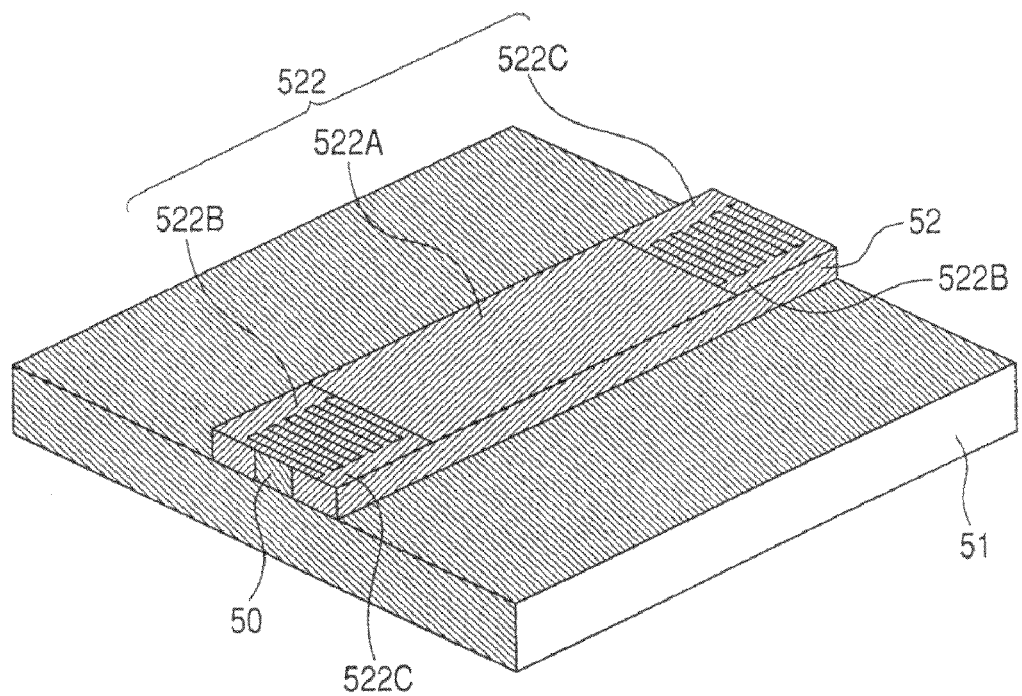
FIGS. 5A and 5B are diagrams illustrating the configuration of an oscillation device of Example 2.
Figure 5B:
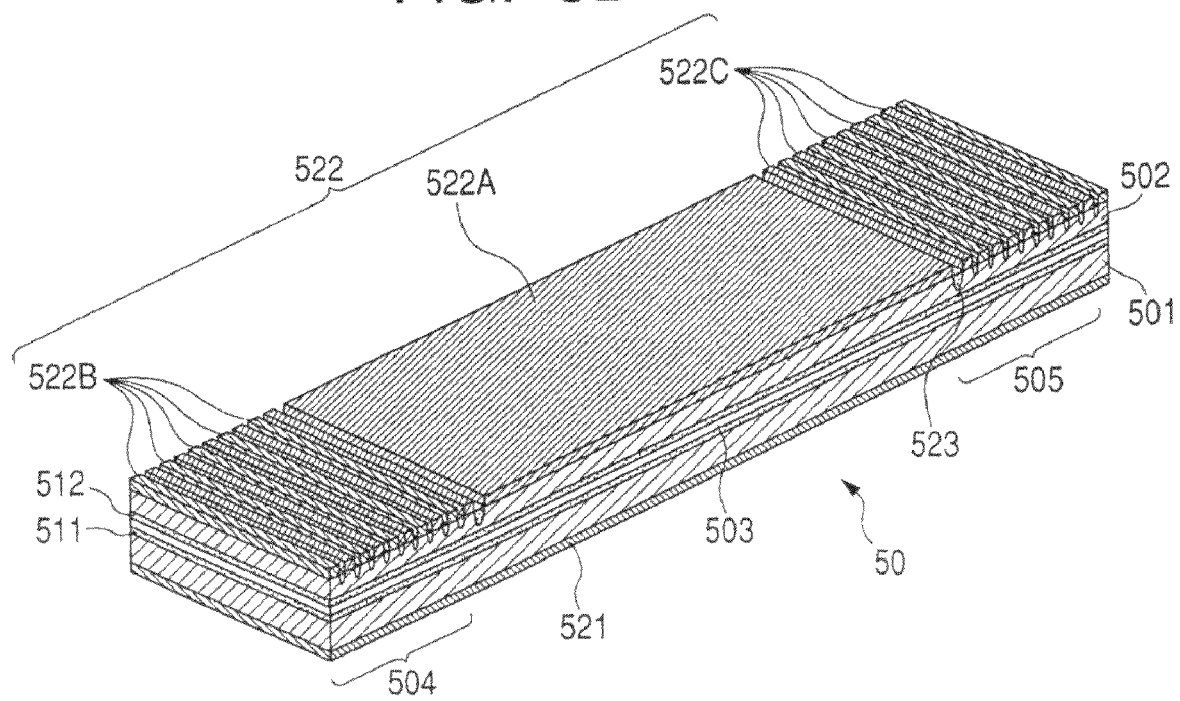

FIGS. 5A and 5B illustrate the configuration of the second example of an oscillation device to which the present invention is applied. FIG. 5B shows, in an enlarged manner, the device body in FIG. 5A. In this example, the cavity structure uses DBR. Since the cavity structure having wavelength selectivity is employed as the cavity structure differently from Example 1, mode hopping becomes difficult to take place. Accordingly, as cavity structure forming the oscillation device to which the present invention can be applied, this example is a more desirable example.

In FIG. 5B, an RTD on the same InP substrate as that of Example 1 is used as a gain medium 503. Electrical contacts 511 and 512 are configured so as to include a semiconductor film of n-InGaAs (thickness 50 nm) having electron concentration of $1 \times 10^{18}$ cm$^{-3}$, and negative permittivity media 501, 502 are configured so as to include a semiconductor film of n-InGaAs (thickness 100 nm) having electron concentration of $1 \times 10^{19}$ cm$^{-3}$. Moreover, as electrodes 521, 522 (522A, 522B, 522C), there is used Ti/Au.

There may be employed-buried type in which these components are disposed on a transfer substrate 51 in FIG. 5A, and are buried by dielectric body 52. DBRs 504, 505 are configured so as to periodically alternately repeat control electrodes 522B, 522C. Here, the dimensions of the device body 50 are set so that size in propagation direction of surface plasmon is 1.2 mm, and size in lateral direction thereof is 20 µm. In this case, the regions of the DBRs 504, 505 thereof are respectively ensured by about 100 µm in the propagation direction of surface plasmon. In FIGS. 5A and 5B, the device body 50 includes drive electrode 522A (separated from control electrodes 522B and 522C) by electrode separation regions 523), and the ground electrode 521.

The DBRs 504, 505 indicate high reflection factor in a specific wavelength depending upon the refractive index distribution period. In the case of this example, the oscillation wavelength is a specific wavelength itself selected by the DBR. This is because the oscillation wavelength is pulled into a wavelength of high Q value of the DBR cavity similarly to the fact that wavelength having refraction factor is selected by Fabry-Perot etalon in accordance with the formula (1). Therefore, the oscillation wavelength depends upon refractive index distribution at the unit period of the DBR, and is expressed as $\lambda = 4n_B L_B = 4n_c L_c$. Here, $n_s$ is equivalent refractive index that the guided mode immediately below the control electrode 522B senses, and $L_B$ is length of surface plasmon waveguide immediately below the control electrode 522B. Moreover, $n_c$ is equivalent refractive index that guided mode immediately below the control electrode 522C senses, and $L_c$ is length of surface plasmon waveguide immediately below the control electrode 522C.

In the above-mentioned oscillation device configuration, as an example of wavelength variable operation, it is assumed that 0.4 V is applied to the drive electrode 522A and 0.0 V is applied to the control electrode 522C. In this case, in order to allow the DBRs 504, 505 to function, an applied voltage to the control electrode 522B is caused to be different from that of the electrode 522C, e.g., 0.6 V is assumed to be applied. Here, there is employed a configuration in which pitches of the control electrodes 522B, 522C are set to 20 µm, and duty is caused to be 55% (ratio between the length of the control electrode 522B and length of the control electrode 522C is 11:9) to periodically repeat five number of operations. When linear interpolation is performed in connection with the relationship between voltage of electrode and equivalent refractive index of guided mode, which is illustrated in FIG. 3D, approximate equivalent refractive index at 0.6 V can be estimated. Thus, calculation is performed such that $\lambda = 4 \times 12.7 \times 11 \leq 4 \times 15.2 \times 9 \leq 550$. Namely, the oscillation wavelength becomes equal to 550 (0.55 THz).

As an example of another wavelength variable operation, it is assumed that 0.4 V is applied to the drive electrode 522A, and 0.8 V is applied to the control electrode 522B. In this case, in order to allow the DBRs 504, 505 to function, the voltage of the control electrode 522C is caused to be a voltage different from the control electrode 522 B, e.g., 0.2 V is assumed to be applied. When the relationship between voltage of electrode and equivalent refractive index of guided mode, which is illustrated in FIG. 3D, is linearly interpolated, approximate equivalent refractive index at 0.2 V can be estimated. Thus, calculation is performed such that $\lambda = 4 \times 11.8 \times 11 \leq 4 \times 14.4 \times 9 \leq 520$. Namely, the oscillation wavelength becomes equal to 520 gm (0.58 THz).

When a voltage applied to the control electrode 522B is swept within the range from 0.6V to 0.8V, and a voltage applied to the control electrode 522C is swept within the range from 0.0V to 0.2V in a manner stated above so that $n_B L_B = n_c L_c$ holds, wavelength variable width becomes equal to about 6%. The above-mentioned numeric values are an example. By further greatly changing control electric field similarly to Example 1, wavelength variable width may be further enlarged. This is because the present example also has the merit to have ability to apply an independent electric field to the drive electrode 522A and control electrodes 522B, 522C.

While the cavity structure configured by periodically repeating control electrodes is caused to be of the DBR type in this example, the present invention is not limited to such implementation. For example, in the above-mentioned oscillation device configuration, there may be a cavity structure of the DR type from which one DBR is excluded. Alternatively, there may be employed of the DFB type in which the length of surface plasmon immediate below the drive electrode is set to extremely short length, and one control electrode at DBR is caused to be drive electrode. Also in the present example, the advantages described in Example 1 can be obtained in addition to the advantages specific to the present example.

Example 3

Figure 6A:
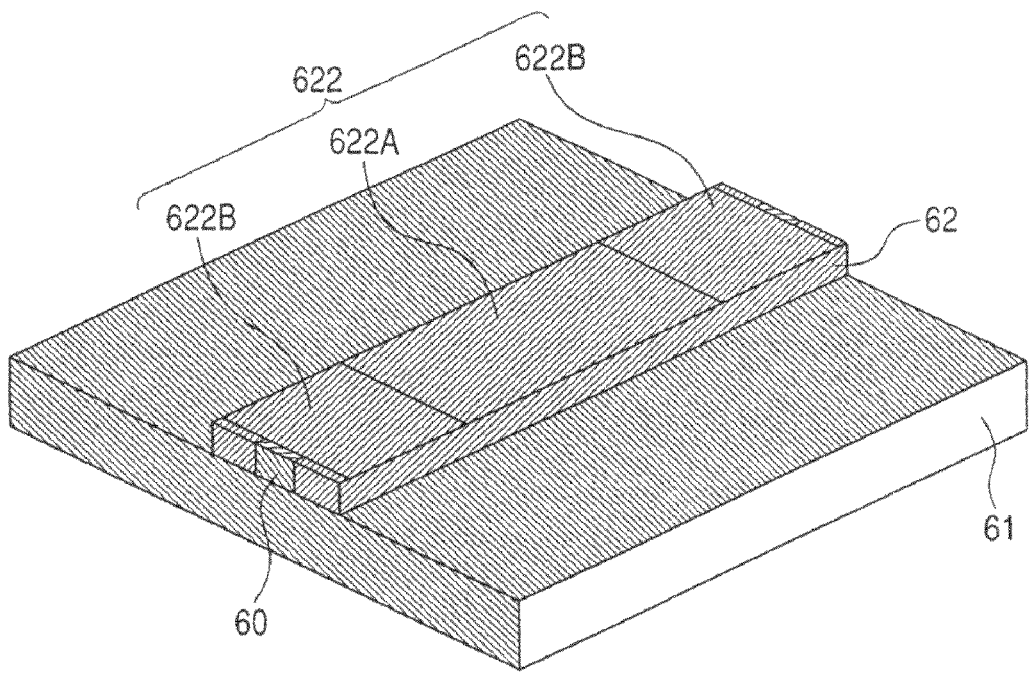
FIGS. 6A and 6B are diagrams illustrating the configuration of an oscillation device of Example 3.
Figure 6B:
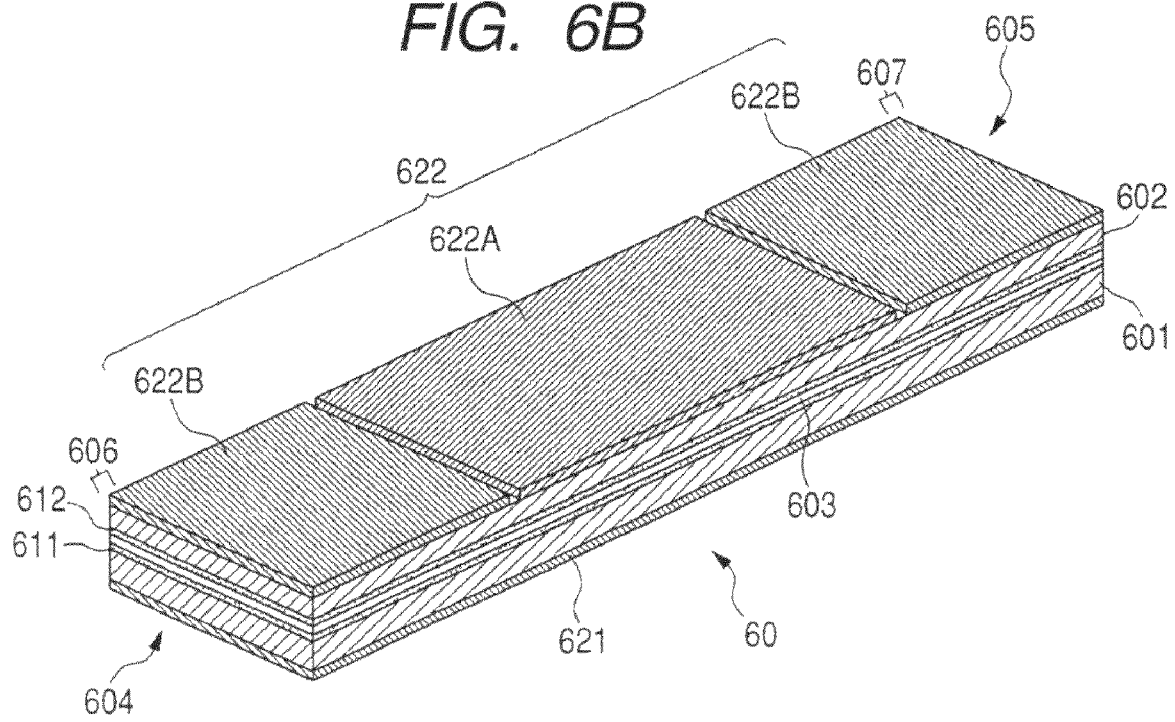

FIGS. 6A and 6B illustrate the configuration of an oscillation device of the third example to which the present invention is applied. FIG. 6B illustrates, in an enlarged manner, a device body 60 in FIG. 6A. In the present example, a gain medium is a resonant inter-band tunneling diode (RITD) based on photon-assisted tunneling. The RITD has a gain of millimeter wave band utilizing the photon-assisted tunneling. Accordingly, there is disclosed a modified example of a gain medium forming an oscillation device to which the present invention can be applied.

In FIG. 6B, a gain medium 603 is RITD, and is of the configuration using Type II hetero-junction, e.g., as in the case of n type δ doped part/spacer layer/Type II spacer layer/p-type δ doped part/Type II p-type layer. In connection with these components, lattice-matched Si may be used on an Si substrate as a spacer layer, and SiGe which is non-matched and serves as Type II hetero-junctioned to Si may be used as a Type II spacer layer or Type II p-type layer. In more practical sense, there is provided a configuration including a semiconductor multilayer structure of n-Si (δ-dope)/Si (thickness 1.0 nm)/SiGe (2.0 nm)/p-SiGe (δ-dope)/p-SiGe (1.0 nm) in order from the emitter side to the collector side (see Appl. Phys. Lett, Vol. 83, 3308 (2003) in connection with the configuration of gain medium). Here, the spacer layer and the Type II spacer layer are caused to be undoped.

Such gain medium 603 is sandwiched between negative permittivity media 601, 602 doubling as electrical contacts 611, 612. The negative permittivity medium 601 is configured so as to include, e.g., a semiconductor film of n-Si (100 nm) which is lattice-matched with an Si substrate. Here, P is used as dopant, and electron density is caused to have $5\times10^{19}$ cm$^{-3}$. The negative permittivity medium 602 is configured so as to include, e.g., a semiconductor film of p-Si (100 nm) which is lattice-matched with an Si substrate. Here, B is used as dopant, and electron concentration is caused to have $5\times10^{19}$ cm$^{-3}$. In this way, the gain medium 603 is in ohmic contact with electrodes 621, 622 (622A, 622B) such as Al.

The RITD has a gain in a frequency region of millimeter wave band on the basis of phenomenon called photon-assisted tunneling. For example, in the above-mentioned RITD, peak current density is about 40 kA/cm$^2$ at the time of application of an electric field of 0.3V, and indicates negative resistance at the time of application of an electric field of 0.3V to 0.4V. There is employed a buried type in which these components are disposed on a transfer substrate 61 and are buried into a dielectric material 62. As the dielectric material 62, there is selected a material having low permittivity and small loss such as BCB.

Here, dimensions of the device body 60 are set such that size in a propagation direction of surface plasmon is 500 μm, and size in a lateral direction is 20 μm. In this case, there are ensured impedance transformation regions 606, 607 such that equivalent refractive index immediately therebelow is lowered without adding the electrode 622 by λ/4n from the end part of the surface plasmon waveguide. This example is directed to an applied example of λ/4 impedance transformation element known in the microwave technology, and is used when there is a desire to enhance coupling efficiency with respect to an external space. It is to be noted that the present invention is not limited to such implementation, but for example, AR coating or lens known in the optical technology may be utilized. These methods or techniques all reduce impedance miss-matching with respect to external space. It is to be noted that the same method may be applied also at the time of enhancing coupling efficiency with respect to an external high frequency transmission path such as microstrip line, or co-planar waveguide. Additionally, in FIG. 6B, the device body 60 includes end faces 604, 605, and the ground electrode 621.

Figure 7A:
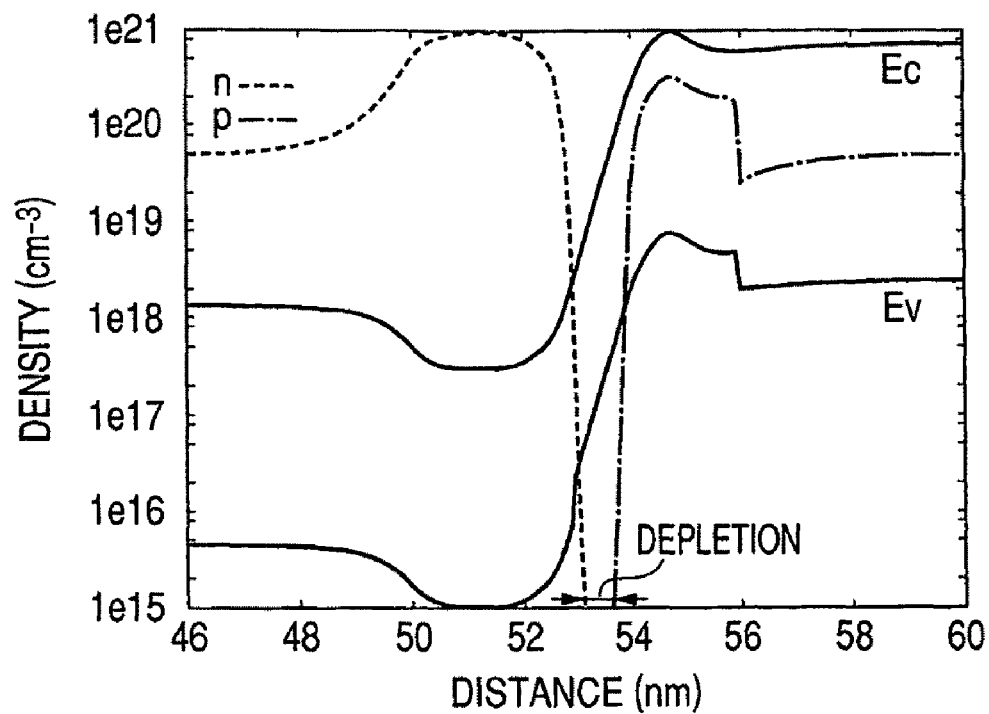
FIGS. 7A, 7B and 7C are diagrams for describing the relationship between electrode voltage and thickness of depletion region of Example 3.
Figure 7B:
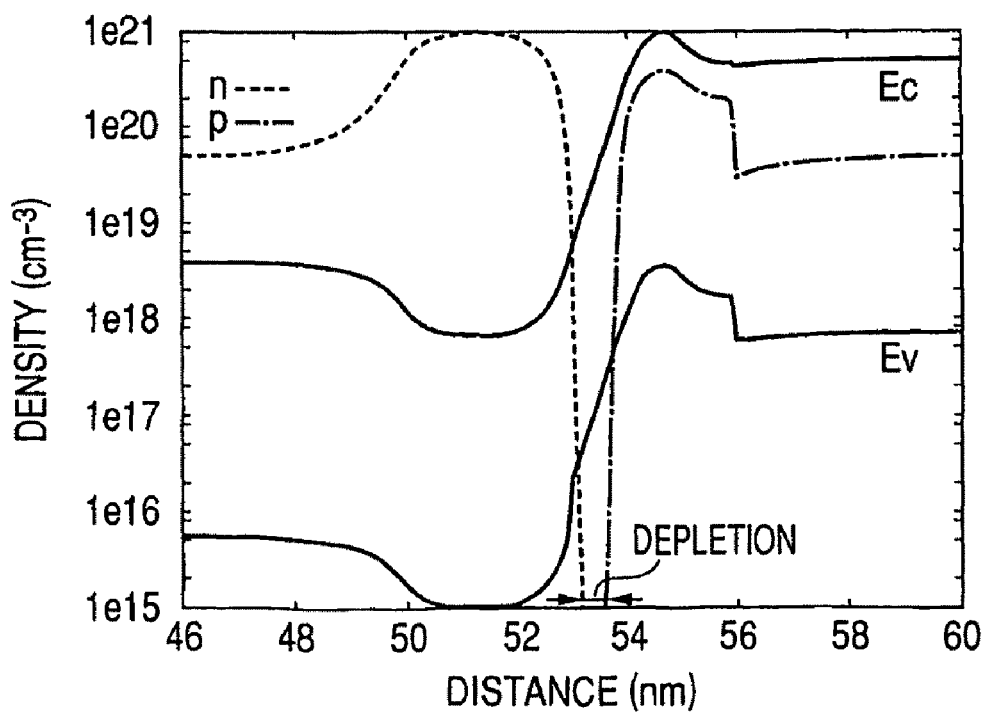
Figure 7C:
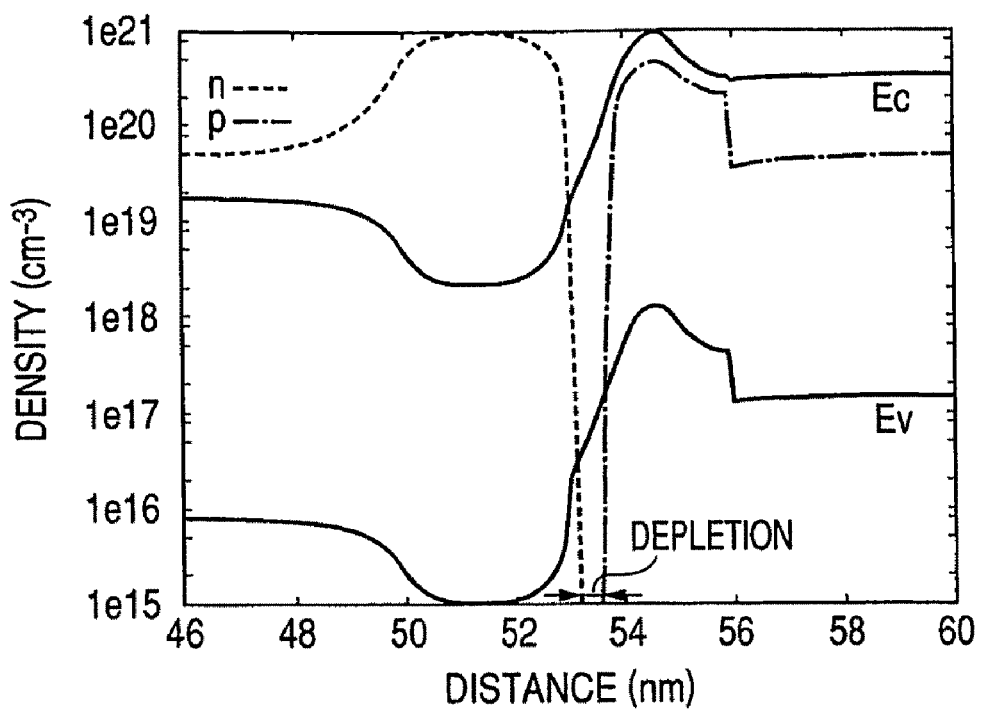

In the above-mentioned oscillation device configuration, in order to estimate the relationship between depletion region and the voltage of the electrode 622 to control the strength of electric field (ground voltage 622 is caused to be reference), numeric calculation was performed by the same technique as that of Example 1. FIGS. 7A to 7C are band diagrams illustrating how the depletion region is changed in accordance with change of the voltage of the electrode 622. In FIGS. 7A to 7C, distance (nm) of the abscissa indicates the positional relationship from the emitter through the gain medium 603 to the collector, and corresponds to upper and lower directions in FIG. 6B. Ec and Ev in FIGS. 7A to 7C respectively indicate conduction band edge and valence band edge, wherein the ordinate indicates an arbitrary unit. In this case, since Si or SiGe is not a direct transition type semiconductor, the minimum point at x-Γ point is used as the conduction band edge with the valence band edge of heavy hole being as reference. Moreover, n and p respectively indicate free carrier concentrations in the conduction band and the valence band, and the ordinate thereof indicates density (cm$^{-3}$).

Here, the depletion region is assumed to have low concentration expressed as n<$1\times10^{15}$ cm$^{-3}$, p<$1\times10^{15}$ cm$^{-3}$ such that the real part of permittivity is positive, which is considered as dielectric like when viewed from an electromagnetic wave of millimeter wave band. The numeric values are one example approximately calculated in the vicinity of 100 GHz. Since plasma frequency corresponding to n=$1\times10^{15}$ cm$^{-3}$ and p=$1\times10^{15}$ cm$^{-3}$ exists in the vicinity of 100 GHz, definition is made in such a manner. In accordance with this definition, also in FIGS. 7A to 7C, illustration is made for easiness of understanding such that the thickness of the depletion region is visually represented as "depletion". FIG. 7A is a band diagram when device voltage is 0.0V, FIG. 7B is a band diagram when device voltage is 0.4V, and FIG. 7C is a diagram when device voltage is 0.8V. It is understood that there is a tendency such that an electric field increases in accordance with increase of voltage, and the depletion region becomes narrow in accordance with increase of electric field within the range from 0.0V to 0.8V as stated above. For example, in FIG. 7C, as compared to FIG. 7A, the thickness of the depletion region is narrowed by about 0.2 nm.

Figure 7D:
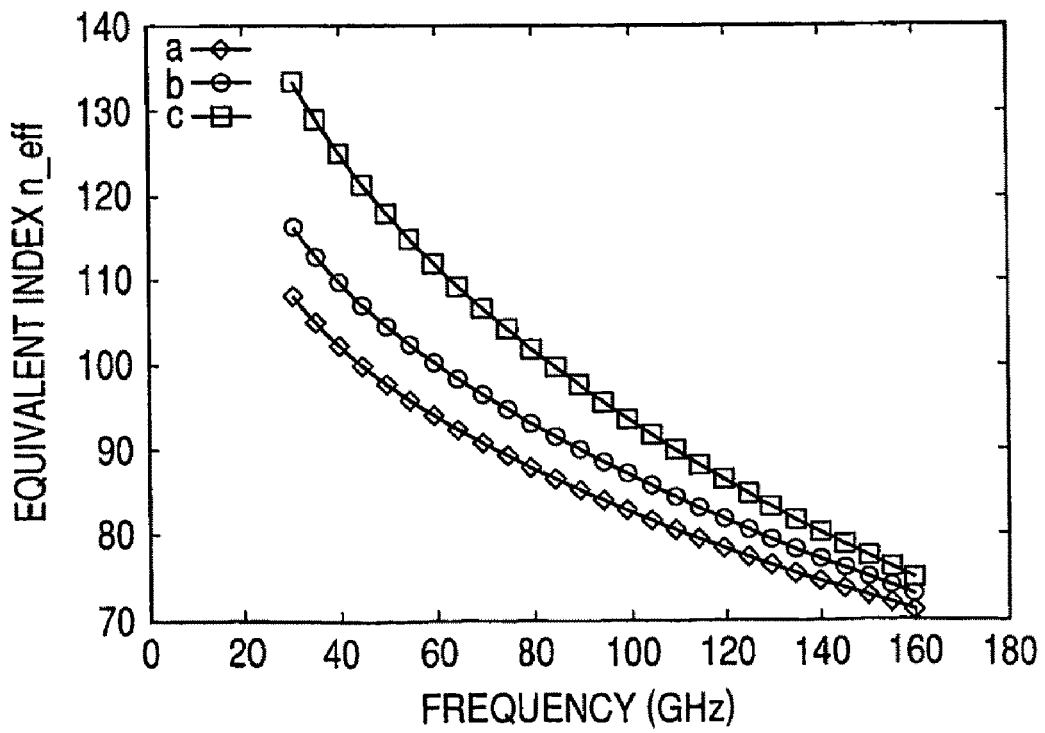
FIG. 7D is a diagram for describing the relationship between thickness of depletion region and equivalent refractive index of guided mode of Example 3.

FIG. 7D illustrates how the voltage of the electrode 622 changes the equivalent refractive index of guided mode immediately therebelow. To this end, respective free carrier concentrations of FIGS. 7A, 7B and 7C in the device configurations are reflected with respect to Drude model so that a calculation model is provided. Calculation was performed within the range from 30 GHz to 160 GHz as an example, wherein frequency (GHz) of the abscissa indicates frequency of fundamental guided mode. The ordinate indicates equivalent refractive index of the fundamental guided mode. In FIG. 7D, a, b, c respectively reflect FIGS. 7A, 7B and 7C. At a corresponding to the case where voltage is 0.0V, the equivalent refractive index of the guided mode in the vicinity of 30 GHz is 108, for example. At b corresponding to the case where voltage is 0.4V, the equivalent refractive index of guided mode similarly in the vicinity of, e.g., 30 GHz is 117. At c corresponding to the case where voltage is 0.8V, the equivalent refractive index of the guide wave similarly in the vicinity of 30 GHz is 134. From facts described above, if the voltage of the electrode 622 is reread as a control electrode 622B voltage as it is, the voltage of a control electrode 622B is swept within the range from 0.0V to 0.8V so that the equivalent refractive index of the guided mode immediately therebelow can be changed within the range from 108 to 134.

Figure 8:
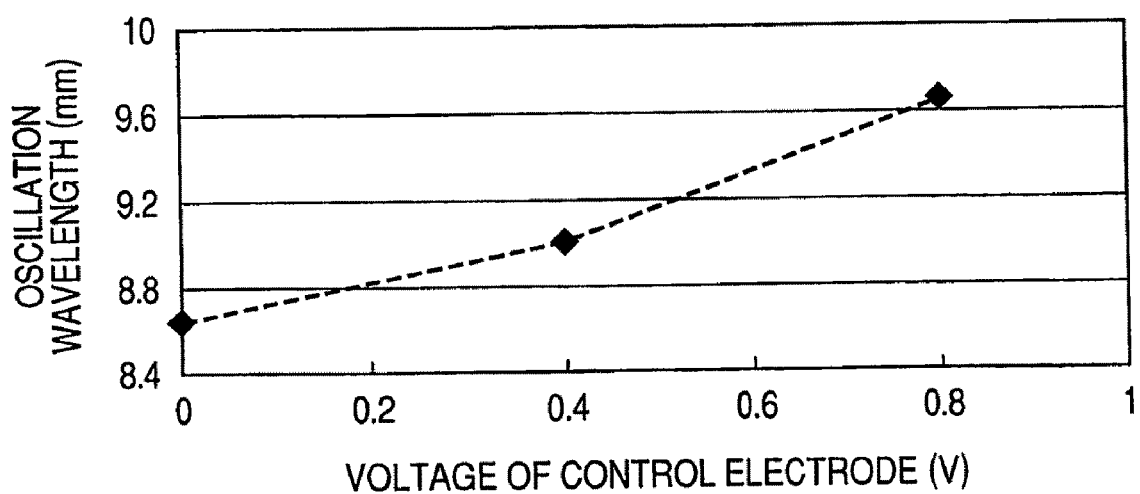
FIG. 8 is a diagram for describing the relationship between voltage applied to a control electrode and oscillation wavelength of Example 3.

In the above-mentioned oscillation device configuration, an oscillation wavelength is estimated. At the time of ordinary operation, it is assumed that 0.4V is applied to a drive electrode 622A and 0.4V is applied to the control electrode 622B. At this time, from the formula (1), the relation expressed as $\lambda = 2 \times 117 \times 0.5/m$ (m is integer) holds. For example, when m=13 is selected, the oscillation wavelength becomes equal to about 9.0 mm (33 GHz) (see FIG. 8). Here, the voltage of the control electrode 622B is swept from 0.0V up to 0.8V so that wavelength variable operation is provided. Here, the length $L_A$ of the surface plasmon waveguide immediately below the drive electrode 622A is set to 250 μm, and the length $L_B$ of the surface plasmon waveguide immediately below the control electrode 622B is set to 250 μm. In accordance with the formula (1), when the voltage of the control electrode 622B is 0.0V, the relation expressed as $\lambda = 2 \times (117 \times 0.25 + 108 \times 0.25)/13$ holds. As a result, the oscillation wavelength is changed into about 8.7 mm (35 GHz) (see FIG. 8). When voltage of the control electrode 622B is 0.8V, the relation expressed as $\lambda = 2 \times (117 \times 0.25 + 134 \times 0.25)/13$ holds. As a result, the oscillation wavelength is changed into 9.7 mm (31 GHz) (see FIG. 8). Accordingly, when the voltage of the control electrode 622B is swept as shown in FIG. 8, the wavelength variable width becomes equal to about 11%. The above-mentioned numeric values are one example. By further greatly changing control electric field, wavelength variable width may be further enlarged.

The oscillation device configuration of the present example can be fabricated in accordance with the following fabrication method.

First, the p-Si layer 602, the Type II hetero-junction 603 based on Si/SiGe and the n-Si layer 601 are epitaxially grown on an Si substrate by low temperature molecular beam epitaxy (LT-MBE) process. The reason why low temperature growth is selected is to reduce segregation of dopant. The Al 621 is deposited as an electrode on the surface thereof to perform etching down to the substrate so as to take a mesa shape in which width is 20 μm and length is 500 μm as stated above. Next, bonding by pressure-fitting is performed between the electrode 621 and an Al thin film on the transfer substrate 61 where the Al thin film is deposited. Thereafter, when such a wet-etching to selectively remove only the Si substrate is performed, there results a form such that the mesa-shaped epitaxial layer is transferred onto the transfer substrate 61. Next, the BCB 62 is coated thereafter to expose the mesa-shaped epitaxial layer. Finally, the drive electrode 622A and control electrode 622B are formed on the surface of the p-Si layer 602 which has appeared after the Si substrate has been removed. Thus, the above-mentioned configuration is completed.

Also in the present example, the advantages which have been described in Example 1 similarly including Fabry-Perot etalon cavity can be provided.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2006-344565, filed on Dec. 21, 2006, which is hereby incorporated by reference herein in its entirety.

The invention claimed is:

1. An oscillation device for oscillating an electromagnetic wave having a frequency selected from a frequency region from 30 GHz to 30 THz, comprising:
    a first negative permittivity medium of which a real part of permittivity with respect to the electromagnetic wave is negative;
    a second negative permittivity medium of which a real part of permittivity with respect to the electromagnetic wave is negative;
    a gain medium sandwiched between the first negative permittivity medium and the second negative permittivity medium, and having a gain with respect to the electromagnetic wave;
    a cavity structure for resonating the electromagnetic wave;
    a drive electrode for injecting carriers into the gain medium to drive the gain medium; and
    a control electrode to change thickness of a depletion region formed between at least one of the first and second negative permittivity media and the gain medium for controlling oscillation wavelength, wherein the control electrode is configured to apply an electric potential independently of the drive electrode.

2. The oscillation device according to claim 1,
    wherein the cavity structure is configured so as to include a waveguide for propagating the electromagnetic wave,
    the gain medium extends along a propagation direction of the electromagnetic wave, and is sandwiched between a first clad of the first negative permittivity medium and a second clad of the second negative permittivity medium at upper and lower parts in a thickness direction thereof, and
    the waveguide is configured so as to include the gain medium, the first clad and the second clad.

3. The oscillation device according to claim 1,
    wherein at least one of the first negative permittivity medium and the second negative permittivity medium is configured so as to include a metal, a carrier-doped semiconductor, or a metal and a carrier-doped semiconductor.

4. The oscillation device according to claim 1,
    wherein the gain medium is a resonant tunneling diode based on photon-assisted tunneling.

5. The oscillation device according to claim 1,
    wherein the drive electrode comprises a first electrode provided on the first negative permittivity medium and a second electrode provided on the second negative permittivity medium, and
    the control electrode comprises a third electrode provided on at least one of the first negative permittivity medium and the second negative permittivity medium.

* * * * *